United States Patent
Kishimoto et al.

(10) Patent No.: US 6,979,589 B2
(45) Date of Patent: Dec. 27, 2005

(54) SILICON-BASED THIN-FILM PHOTOELECTRIC CONVERSION DEVICE AND METHOD OF MANUFACTURING THEREOF

(75) Inventors: Katsushi Kishimoto, Soraku-gun (JP); Yusuke Fukuoka, Ikoma-gun (JP); Katsuhiko Nomoto, Kashiwara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/942,958

(22) Filed: Sep. 17, 2004

(65) Prior Publication Data
US 2005/0085003 A1    Apr. 21, 2005

(30) Foreign Application Priority Data
Oct. 17, 2003    (JP) .............................. 2003-358091

(51) Int. Cl.⁷ .............................................. H01L 21/00
(52) U.S. Cl. .................... 438/97; 438/485; 438/488
(58) Field of Search .............................. 438/61, 96, 97, 438/482, 488, 489

(56) References Cited

U.S. PATENT DOCUMENTS
5,563,075 A * 10/1996 Saito et al. .................... 438/87

FOREIGN PATENT DOCUMENTS
JP    2000-243993    9/2000
JP    2000-252495    9/2000

* cited by examiner

Primary Examiner—Phuc T. Dang
(74) Attorney, Agent, or Firm—Nixon & Vanderhye, P.C.

(57) ABSTRACT

An excellent silicon-based thin-film photoelectric conversion device is manufactured simply and efficiently at a low cost. Specifically, a method of manufacturing the silicon-based thin-film photoelectric conversion device including a p-type semiconductor layer, an i-type microcrystalline silicon-based photoelectric conversion layer and an n-type semiconductor layer deposited by plasma CVD includes the steps of: successively depositing the p-type semiconductor layer, the i-type microcrystalline silicon-based photoelectric conversion layer and the n-type semiconductor layer on a substrate within the same plasma CVD film deposition chamber; transferring the substrate out of the film deposition chamber; and subsequently to the step of depositing the p-type semiconductor layer, the i-type microcrystalline silicon-based photoelectric conversion layer and the n-type semiconductor layer, eliminating influences of remaining n-type impurities on a cathode and/or within the film deposition chamber.

12 Claims, 3 Drawing Sheets

SILICON-BASED THIN-FILM PHOTOELECTRIC CONVERSION DEVICE AND METHOD OF MANUFACTURING THEREOF

This nonprovisional application is based on Japanese Patent Application No. 2003-358091 filed with the Japan Patent Office on Oct. 17, 2003, the entire contents of which are hereby incorporated by reference.

BACKGROUND OF THE INVENTION

1. Field of the Invention

The present invention relates to a method of manufacturing a silicon-based thin-film photoelectric conversion device having excellent performance. In particular, the present invention relates to a silicon-based thin-film photoelectric conversion device dramatically improved in production cost and production efficiency.

2. Description of the Background Art

In recent years, development of and increased production volume of solar cells using thin films containing such a crystalline silicon as polycrystalline silicon or microcrystalline silicon for example have received worldwide attention. A significant feature of this type of solar cells is in that reduction in cost and improvements in performance are simultaneously achieved by depositing semiconductor films or metal electrode films on a large-area and low-cost substrate with such a film deposition apparatus as plasma CVD apparatus or sputtering apparatus and thereafter separating and connecting resultant solar cells fabricated on the same substrate by means of laser patterning for example. Key apparatuses used in the process of manufacturing the devices, CVD apparatus for example, are increasing in cost to add the production cost of the solar cells. The increased cost is thus one of factors that hinder large-scale and widespread use of the solar cells. Here, it is noted that the terms "polycrystalline" and "microcrystalline" herein refer to crystals that are partially in an amorphous state.

Conventional manufacturing apparatuses of solar cells employ the inline system having a plurality of film deposition chambers (also referred to simply as chambers) linearly coupled to each other or the multi-chamber system having a plurality of film deposition chambers arranged around a central intermediate chamber. Regarding the inline system, however, the substrate is transported linearly, which means that the whole apparatus has to be stopped even if only a part of the apparatus fails to need maintenance. For example, the manufacturing process includes multiple steps for depositing i-layers that require maintenance most as compared with other components. Therefore, a disadvantage of the inline system is that, even if one film deposition chamber for forming i-layers requires maintenance, the entire manufacturing line has to be stopped.

Regarding the multi-chamber system, the substrate on which films are to be deposited is transported via the intermediate chamber to an appropriate one of the deposition chambers and a movable partition is provided between each of the deposition chambers and the intermediate chamber for keeping airtightness therebetween. Then, even if one of the deposition chambers fails, other deposition chambers are available, which means that the whole stop of the production does not occur. The manufacturing apparatus of the multi-chamber system, however, has a plurality of lines along which the substrate is transported via the intermediate chamber, resulting in an inevitable increase in complexity of the mechanical structure of the intermediate chamber. For example, the mechanism for maintaining the airtightness between the intermediate chamber and each of the deposition chambers while transporting the substrate is complicated to increase the cost. A further problem is that the number of film deposition chambers arranged around the intermediate chamber is limited in terms of space.

In view of the above-described problems, Japanese Patent Laying-Open No. 2000-252495 proposes a method of manufacturing a silicon-based thin-film photoelectric conversion device characterized in that a p-type semiconductor layer, an i-type microcrystalline silicon-based photoelectric conversion layer and an n-type semiconductor layer are deposited successively in the same plasma CVD film deposition chamber and the p-type semiconductor layer is deposited under the condition that the pressure in the film deposition chamber is at least 667 Pa. According to Japanese Patent Laying-Open No. 2000-252495, the proposed method can be used to manufacture photoelectric conversion devices having excellent performance and quality with a simple apparatus at a low cost and a high efficiency. The manufacturing method includes the steps of repeatedly forming the p-type semiconductor layer, the i-type microcrystalline silicon-based photoelectric conversion layer and the n-type semiconductor layer (hereinafter simply referred to as "pin layers" in some cases) within the same deposition chamber for the purpose of improving productivity. A problem of this method is therefore that the initial stages of the steps of depositing the p-layer and the i-layer are inevitably affected by n-type dopants remaining on the cathode and in the film deposition chamber that are dopants used in the preceding step of depositing the n-layer.

For example, the n-type dopants influence the p-layer by weakening the function of p-type dopants, so that p-type space charge necessary for manufacturing solar cells cannot be ensured. Consequently, there arise such adverse effects on various parameters of solar cells as decreases in open circuit voltage and polarity factor. In addition, regarding influences of the n-type dopants on the i-layer, Japanese Patent Laying-Open No. 2000-243993 shows that diffusion of remaining n-type dopants into the i-layer increases the recombination level in the i-layer to weaken the internal electric field, resulting in a considerable decrease in shortwave sensitivity of solar cells.

SUMMARY OF THE INVENTION

An object of the present invention is to provide a method of manufacturing a silicon-based thin-film photoelectric conversion device having excellent performance and quality with a simple manufacturing apparatus at a low cost and a high efficiency. Another object of the present invention is to provide a method of manufacturing a silicon-based thin-film photoelectric conversion device that can be used to repeatedly manufacture photoelectric conversion devices with a good manufacturing yield.

A method of manufacturing a silicon-based thin-film photoelectric conversion device according to one aspect of the present invention is a method of manufacturing a silicon-based thin-film photoelectric conversion device having a multilayered structure comprised of a p-type semiconductor layer, an i-type microcrystalline silicon-based photoelectric conversion layer and an n-type semiconductor layer by plasma CVD, the method including the steps of: successively depositing the p-type semiconductor layer, the i-type microcrystalline silicon-based photoelectric conversion layer and the n-type semiconductor layer on a substrate within the same plasma CVD film deposition chamber;

transferring the substrate out of the film deposition chamber; and eliminating influences of remaining n-type impurities on a cathode and/or within the film deposition chamber, on a subsequent step of depositing the p-type semiconductor layer, the i-type microcrystalline silicon-based photoelectric conversion layer and the n-type semiconductor layer.

Further, a method of manufacturing a silicon-based thin-film photoelectric conversion device according to another aspect of the present invention is a method of manufacturing a stacked silicon-based thin-film photoelectric conversion device by depositing at least one photoelectric conversion device including an amorphous silicon-based photoelectric conversion layer on at least one photoelectric conversion device including a microcrystalline silicon-based photoelectric conversion layer manufactured by the above-described method. Moreover, a silicon-based thin-film photoelectric conversion device manufactured according to the above-described method is provided.

According to the present invention, thin films of the pin structure can repeatedly be deposited using the same plasma CVD film deposition chamber, so that a silicon-based thin-film photoelectric conversion device having excellent photoelectric conversion characteristics can be manufactured simply and efficiently at a low cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
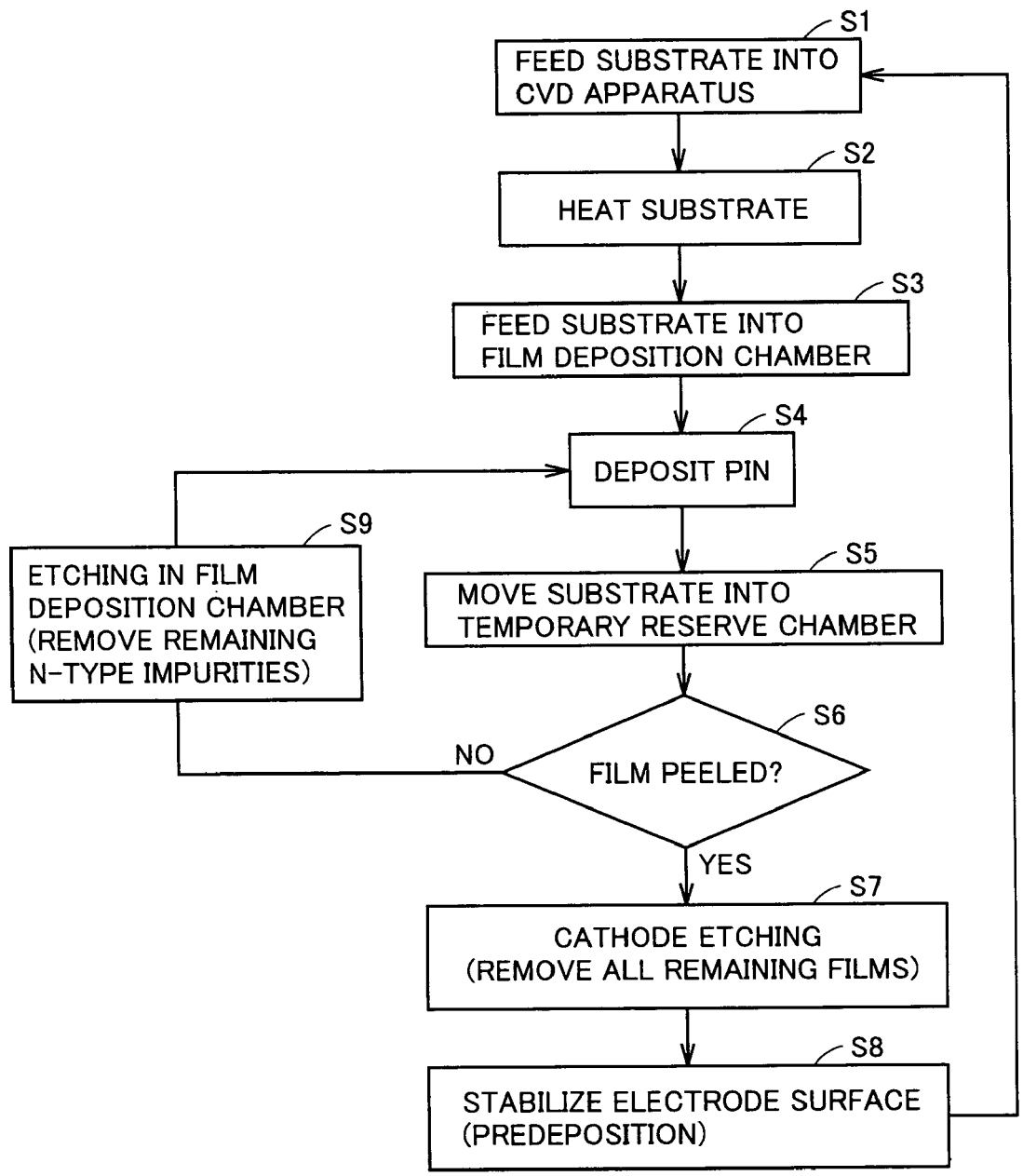
FIG. 1 is a flowchart schematically showing a typical and exemplary method of manufacturing a silicon-based thin-film photoelectric conversion device according to the present invention.

According to the present invention, a method of manufacturing a silicon-based thin-film photoelectric conversion device includes the steps of: successively depositing a p-type semiconductor layer, an i-type microcrystalline silicon-based photoelectric conversion layer and an n-type semiconductor layer on a substrate within the same plasma CVD film deposition chamber; transferring the substrate out of the film deposition chamber; and subsequently to the step of depositing the p-type semiconductor layer, the i-type microcrystalline silicon-based photoelectric conversion layer and the n-type semiconductor layer, eliminating influences of remaining n-type impurities on a cathode and/or within the film deposition chamber. The pin layers are deposited within the same film deposition chamber, the substrate is then taken out of the chamber and thereafter remaining n-type impurities are removed, so that the photoelectric conversion device having the pin structure with excellent quality and performance can repeatedly be manufactured.

If pin layer are deposited on a substrate and successively subsequent pin layers are deposited on a subsequent substrate, it is inevitable that remaining n-type impurity atoms are mixed into the subsequent p-type semiconductor layer and the subsequent i-type photoelectric conversion layer. In other words, remaining n-type impurity atoms attached to the inner wall surface of the film deposition chamber and a cathode for example are taken into the p-type semiconductor layer and the i-type photoelectric conversion layer that are being deposited. According to the present invention, influences of n-type impurities remaining on the cathode and/or within the film deposition chamber on a subsequent process of depositing pin layers are eliminated and thus the pin layers can successively be deposited with good reproducibility.

A characteristic of the method of manufacturing a silicon-based thin-film photoelectric conversion device of the present invention is in the step of eliminating influences of remaining n-type impurities on a subsequent process of depositing pin layers. With this step, even if a photoelectric conversion device is manufactured by the single chamber system, the influences of remaining n-type impurities can be eliminated so that mixing of n-type impurity atoms into the p-type semiconductor layer and the i-type photoelectric conversion layer can remarkably be reduced. Accordingly, pin layers having excellent quality and performance can repeatedly be deposited by the single chamber system, so that the cost can be reduced with simplified manufacturing facilities as compared with the inline system and the multi-chamber system.

The thickness of the p-type semiconductor layer is preferably at least 2 nm and more preferably at least 5 nm for applying a sufficient internal electric field to the i-type microcrystalline silicon-based photoelectric conversion layer. Further, the thickness of the p-type semiconductor layer is preferably at most 50 nm and more preferably at most 30 nm since it is necessary to reduce the amount of light absorbed by an inactive layer on the light-incident side. The thickness of the i-type microcrystalline silicon-based photoelectric conversion layer is preferably at least 0.5 $\mu$m and more preferably at least 1 $\mu$m for allowing the silicon-based thin-film photoelectric conversion layer including microcrystal to fully exhibit its function. Further, the thickness of the i-type photoelectric conversion layer is preferably at most 20 $\mu$m and more preferably at most 15 $\mu$m since it is necessary to ensure productivity of the devices. The thickness of the n-type semiconductor layer is preferably at least 2 nm and more preferably at least 5 nm for applying a sufficient internal electric field to the i-type photoelectric conversion layer. Further, the thickness of the n-type semiconductor layer is preferably at most 50 nm and more preferably at most 30 nm for reducing the amount of remaining n-type impurities to be etched away and facilitating the operation of removing the remaining n-type impurities.

The step of eliminating influences of remaining n-type impurities can be effected through plasma decomposition of hydrogen gas, inert gas or fluorine-based cleaning gas or an arbitrary mixture thereof. With this step, pin layers can repeatedly be deposited and accordingly photoelectric conversion devices can be manufactured with good reproducibility. Although etching can appropriately be performed with any of the above-described gases, it is preferable that nitrogen trifluoride is plasma-decomposed since it provides a relatively higher etch rate for remaining n-type impurities. A preferable inert gas may vary depending on etching conditions, however, argon gas is generally preferred.

The step of eliminating influences of remaining n-type impurities is effected for example by etching away an n layer deposited within the film deposition chamber and thereafter etching away an i-layer by preferably at least 10 nm in thickness and more preferably at least 15 nm in thickness. If the thickness of the removed portion of the i-layer is less than 10 nm, it is difficult to completely eliminate influences of remaining n-type impurities diffused in the i-layer. Further, this step is effected by etching away preferably at most a half in thickness of the i-layer and more preferably at most one-third in thickness of the i-layer. If the thickness of the etched portion of the i-layer is larger than a half in thickness of the original i-layer, the treatment ability of the apparatus could deteriorate and influences of remaining p-type impurities in the underlying layer could be exerted so that the amount of dopants for a p-layer deposited in the subsequent step could be different from an optimum value thereof Therefore, the i-layer is preferably etched away by approximately 50 nm in thickness together with the n-layer to completely eliminate influences of remaining n-type impurities. After the step of removing remaining n-type impurities, a subsequent substrate is fed into the chamber to repeatedly deposit pin layers.

When the step of depositing pin layers is repeated multiple times (herein referred to as pin deposition number), remaining and non-etched-away films of the number corresponding to the pin deposition number are stacked on a cathode. If the manufacturing process is continued in this state, the stacked and remaining films are peeled off from the surface of the electrode due to an internal stress so that the peeled-off films now in the form of powder with a particle size of a few $\mu$m in diameter could be taken into pin layers being deposited on a substrate. The taken-in powder generates a point defect to cause short-circuit of upper and lower electrodes, resulting in a considerable decrease in manufacturing yield of photoelectric conversion devices to 30% or lower. Then, when it is found that any films are peeled off from the cathode after pin layers are deposited, all the remaining films on the cathode are preferably removed. Even if no film is peeled off from the cathode, preferably the above-described defect is prevented from occurring before any films are peeled off for keeping a certain manufacturing yield of photoelectric conversion devices. Occurrence of peeling-off of remaining films depends largely on the film deposition conditions and the surface state of the electrode when the films are stacked thereon. Supposing that silicon-based thin films are deposited with a plasma CVD apparatus, the peeling of films is likely to occur generally when the total thickness of the films of remaining impurities on the cathode is at least 10 $\mu$m and at most 1000 $\mu$m. Thus, when the total thickness of films of remaining impurities on the cathode is preferably at least 10 $\mu$m and at most 800 $\mu$m and more preferably at least 300 $\mu$m and at most 500 $\mu$m, all the remaining films on the cathode are preferably removed.

All the remaining films stacked on the cathode can be removed by plasma decomposition of hydrogen gas, inert gas, fluorine-based cleaning gas or an arbitrary mixture thereof Preferably, such a fluorine-based cleaning gas as nitrogen trifluoride is used since it provides a relatively high etch rate for the remaining films. For example, as an etching gas and a diluent gas, nitrogen trifluoride and argon gas of 20 volume % in concentration are supplied into the film deposition chamber and etching is done under a pressure of at most 133 Pa. Then, an etch rate of at least 10 nm/s is achieved. After this cleaning, predeposition of a silicon film is done for making the electrode surface stable and thus the process of depositing pin layers can successively be performed.

Preferably, the p-type semiconductor layer is deposited under the conditions that a heating temperature of the substrate (the temperature at which the substrate is heated) is at most 550° C., a source gas supplied into the film deposition chamber includes a silane-based gas and a diluent gas containing hydrogen gas, and the diluent gas has a flow rate at least 100 times as high as that of the silane-based gas. With the heating temperature of preferably at most 550° C., such a material as inexpensive glass can be employed to reduce the cost. Further, with the flow rate of the diluent gas that is preferably at least 100 times and more preferably at least 120 times as high as that of the silane-based gas, a satisfactory crystallization ratio is achieved. Moreover, even after the cleaning process, the p-type semiconductor layer can be deposited with good reproducibility. Impurity atoms determining the conductivity type of the p-type semiconductor layer may be selected appropriately from boron and aluminum for example.

Similarly, the i-type microcrystalline silicon-based photoelectric conversion layer is deposited with a heating temperature of the substrate that is preferably at most 550° C., so that such a material as inexpensive glass can be employed as the substrate. Further, a source gas supplied into the film deposition chamber includes a silane-based gas and a diluent gas with a flow rate of the diluent gas preferably at least 30 times, and preferably at most 100 times and more preferably at most 80 times as high as that of the silane-based gas. Moreover, the peak intensity ratio at 480 $nm^{-1}$ and 520 $nm^{-1}$ measured by Raman spectroscopy, $I_{520}/I_{480}$, is preferably at least 5 and at most 10. By selecting the above-described manner, a satisfactory crystallization ratio is achieved so that the i-type photoelectric conversion layer can be deposited with good reproducibility even after the cleaning process.

Similarly, the n-type semiconductor layer is deposited with a heating temperature of the substrate that is preferably at most 550° C., so that such a material as inexpensive glass can be employed as the substrate. Phosphorus may be selected as impurity atoms determining the conductivity type of the n-type semiconductor layer. When the phosphorus is selected, the content thereof is preferably at least 0.1 atomic percent and more preferably at least 0.3 atomic percent with respect to silicon in the source gas for achieving a sufficient doping effect. Here, atomic percent refers to the ratio of the number of atoms of the doping element with respect to the number of silicon atoms that is represented in percentage. Regarding the upper limit of the phosphorus content, the content of phosphorus is at most 5 atomic percent and more preferably at most 3 atomic percent for avoiding deterioration of the film quality.

On at least one photoelectric conversion device including a microcrystalline silicon-based photoelectric conversion layer as described above, at least one photoelectric conversion device including an amorphous silicon-based photoelectric conversion layer may be stacked, so that a stacked photoelectric conversion device having a high photoelectric conversion efficiency can be produced. Further, the silicon-based thin-film photoelectric conversion device of the present invention that is provided by using the above-described method requires a low cost and has high performance.

Figure 2:
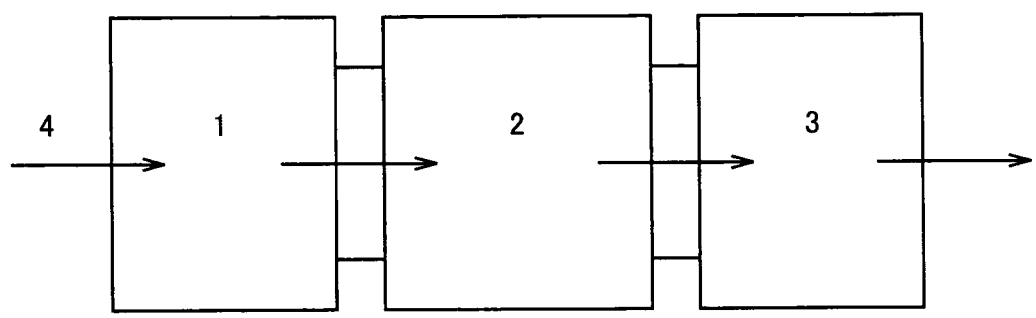
FIG. 2 schematically shows a plasma CVD apparatus employed in the present invention.
Figure 3:
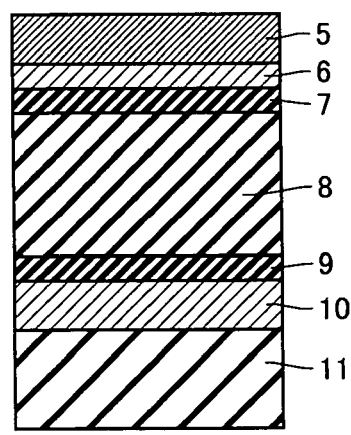
FIG. 3 is a cross-sectional view of a structure of a silicon-based thin-film photoelectric conversion device manufactured by a method according to the present invention.

An embodiment of the present invention is hereinafter described in connection with the drawings. FIG. 3 shows a typical and exemplary silicon-based thin-film photoelectric conversion device manufactured by the method of the present invention. The photoelectric conversion device includes a transparent substrate 11 on which a transparent, electrically-conductive film (hereinafter transparent conductive film) 10, a p-type semiconductor layer 9, an i-type microcrystalline silicon-based photoelectric conversion layer 8, an n-type semiconductor layer 7, an electrically-conductive film (hereinafter conductive film) 6 and a metal electrode 5 are formed in order. FIG. 2 schematically shows a plasma CVD apparatus employed in the present invention having a heating chamber 1, a film deposition chamber 2 and a temporary reserve chamber 3, and the substrate is transported in the direction indicated by an arrow 4.

FIG. 1 is a flowchart schematically showing a typical and exemplary method of manufacturing a silicon-based thin-film photoelectric conversion device according to the present invention. First, a transparent conductive film is formed on a transparent substrate of glass for example. Next, in step (hereinafter abbreviated as S) 1, the substrate is fed into a plasma CVD apparatus. The transparent conductive film of $SnO_2$ for example is used here. Instead of the $SnO_2$ film, a transparent conductive oxide film of ITO or ZnO for example may be used. Then, in S2, the substrate fed into the plasma CVD apparatus is heated to and kept at a film deposition temperature for a certain period of time in the heating chamber. In S3, the substrate is thereafter fed into the film deposition chamber and, in S4, pin layers are deposited. In the film deposition chamber, a p-type semiconductor layer is first deposited by plasma CVD on the transparent conductive film. Preferably, this p-type semiconductor layer is deposited under the condition that the heating temperature of the substrate in the film deposition chamber is at most 550° C. and to a thickness of at least 2 nm and at most 50 nm. Preferably, a source gas supplied into the film deposition chamber has main components that are for example such a silane-based gas as silane gas and a diluent gas of hydrogen gas for example. Further, preferably the flow rate of the diluent gas is at least 100 times as high as the flow rate of the silane-based gas and diborane is used as a doping gas.

The p-type semiconductor layer may be a p-type amorphous or microcrystalline silicon thin-film that is doped for example with boron, which is impurity atom determining the conductivity type, of at least 1 atomic percent and at most 5 atomic percent. The above-described conditions concerning the p-type semiconductor layer are not limitations. For example, such impurity atoms as aluminum atoms may be used. Further, the p-type layer may be a layer of such an alloy as amorphous or microcrystalline silicon carbide or amorphous silicon germanium. The thickness of the p-type layer may be any in the range from 2 nm to 50 nm inclusive. Moreover, the p-type semiconductor layer may be a polycrystalline silicon-based thin-film, an alloy-based thin-film, or a multilayer of a plurality of different thin films.

After the p-type semiconductor layer is deposited, an i-type microcrystalline silicon-based photoelectric conversion layer and an n-type semiconductor layer are deposited in this order on the p-type semiconductor layer in the same film deposition chamber with plasma CVD. Preferably, the i-type microcrystalline silicon-based photoelectric conversion layer is deposited to a thickness of at least 0.5 μm and at most 20 μm, and the n-type semiconductor layer is deposited to a thickness of at least 2 nm and at most 50 nm. The i-type photoelectric conversion layer is preferably deposited under the conditions that the heating temperature of the substrate is at most 550° C. and the flow rate of a diluent gas is at least 30 times and at most 100 times as high as the flow rate of a silane-based gas. Further, the peak intensity ratio at 480 nm$^{-1}$ and 520 nm$^{-1}$ measured by Raman spectroscopy, $I_{520}/I_{480}$, is at least 5 and at most 10. The microcrystalline silicon-based thin-film may be an i-type microcrystalline silicon thin-film or a weak p-type or weak n-type microcrystalline silicon thin-film having a satisfactory photoelectric conversion function. The photoelectric conversion layer is not limited to the above-described ones. For example, an alloy layer of silicon carbide or silicon germanium may be used as well.

As the n-type semiconductor layer, an n-type amorphous or microcrystalline silicon-based thin-film doped with phosphorus, if impurity atoms determining the conductivity type are phosphorus atoms, of at least 0.1 atomic percent and at most 5 atomic percent, for example. The conditions concerning the n-type semiconductor layer are not limitations. An alloy layer of microcrystalline silicon carbide or silicon germanium for example may be used. The thickness of the n-type semiconductor layer is appropriately in the range from 2 nm to 50 nm inclusive.

According to the flowchart shown in FIG. 1, in S5, the substrate is fed into the temporary reserve chamber. Then, in S6, it is checked whether such abnormality as peeling of films from a cathode occurs. If any abnormality is found (YES in S6), the manufacturing process proceeds to S7 and preferably the cathode is etched for removing all the remaining films on the cathode and the surface of the electrode is made stable (predeposited) in S8. If there is no abnormality (NO in S6), the process proceeds to S9 to etch the film deposition chamber and eliminate influences of remaining n-type impurities attached within the film deposition chamber when the final n-layer has been deposited. Remaining n-type impurities may be removed by plasma decomposition of hydrogen gas, inert gas, fluorine-based cleaning gas or an arbitrary mixture thereof Preferably, influences of n-type impurities are eliminated by first etching away an n-layer deposited within the film deposition chamber and thereafter etching away an i-layer by at least 10 nm in thickness and at most a half of the thickness of the i-layer. After influences of the remaining n-type impurities are completely eliminated, a subsequent substrate is fed into the same film deposition chamber so that the pin layers can repeatedly be deposited. When the step of depositing the pin layers is repeated multiple times (pin deposition number), remaining films of the number corresponding to the pin deposition number that have not been etched away are stacked on the cathode. Therefore, after the pin layers are deposited, if any films are peeled off, preferably all the remaining films on the cathode are removed for removing point defects on the substrate. Further, in order to prevent occurrence of such detects, preferably all the remaining films are removed when the total thickness of the remaining films on the cathode is at least 10 μm and at most 1000 μm. The remaining films are removed by plasma decomposition of hydrogen gas, inert gas, fluorine-based cleaning gas or an arbitrary mixture thereof.

After the pin layers are deposited, a conductive film of ZnO for example is formed on the substrate and subsequently a metal electrode of Ag for example is formed. A back electrode unit is thus constituted of the conductive film and the metal electrode and accordingly a photoelectric conversion device is completed. According to the present invention, the device can be manufactured by the single chamber system so that the manufacturing facilities can be simplified as compared with the inline system or multichamber system. In addition, regarding the plasma CVD apparatus, the apparatus can be operated for a long period of time without opening the film deposition chamber. Therefore, the tact time in manufacture can significantly be shortened to reduce the production cost.

Figure 5:
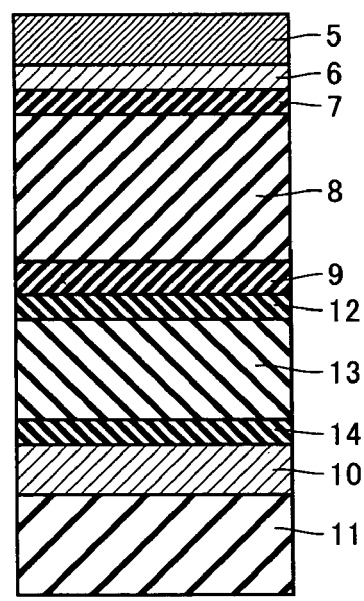
FIG. 5 is a cross-sectional view of a structure of a stacked silicon-based thin-film photoelectric conversion device manufactured by a method according to the present invention.

FIG. 5 is a cross-sectional view schematically showing a structure of a stacked silicon-based thin-film photoelectric conversion device manufactured according to a method of the present invention. In the example shown in FIG. 5, the stacked photoelectric conversion device includes an amorphous photoelectric conversion device 12, 13, 14 and a microcrystalline photoelectric conversion device 7, 8, 9 stacked via a transparent conductive film 10 on a substrate 11. Further, the stacked photoelectric conversion device includes a back electrode unit comprised of a conductive film 6 and a metal electrode 5. The amorphous photoelectric conversion device includes a p-type semiconductor layer 14, an i-type amorphous photoelectric conversion layer 13 and an n-type semiconductor layer 12. The microcrystalline photoelectric conversion device is produced by a similar method to that of the photoelectric conversion device shown in FIG. 3. Specifically, the microcrystalline photoelectric conversion device includes a p-type semiconductor layer 9, an i-type microcrystalline photoelectric conversion layer 8 and an n-type semiconductor layer 7. Similarly, conductive film 6 of ZnO for example and metal electrode 5 of Ag for example may be used.

EXAMPLE 1

In Example 1, silicon-based thin-film photoelectric conversion devices having the structure shown in FIG. 3 were successively manufactured through the manufacturing process repeated multiple times. A first silicon-based thin-film photoelectric conversion device was manufactured by forming transparent conductive film 10 of $SnO_2$ on substrate 11 of glass and thereafter depositing boron-doped p-type semiconductor layer 9 of microcrystalline silicon with a thickness of 10 nm, non-doped i-type photoelectric conversion layer 8 of microcrystalline silicon with a thickness of 3 $\mu$m and phosphorus-doped n-type semiconductor layer 7 of silicon with a thickness of 20 nm in this order on transparent conductive film 10. Further, on n-type semiconductor layer 7, conductive film 6 of ZnO with a thickness of 50 nm and metal electrode 5 of Ag with a thickness of 300 nm were formed so that a back electrode unit comprised of conductive film 6 and metal electrode 5 was provided.

In this example, according to the flowchart shown in FIG. 1, the first silicon-based photoelectric conversion device was produced. The pin layers of the photoelectric conversion device were deposited in the same film deposition chamber with RF plasma CVD under the following conditions. As a film-deposition gas, silane and hydrogen were used. As a doping gas, diborane of 0.5 atomic percent with respect to silane was added in depositing the p-type silicon layer and phosphine of 0.3 atomic percent with respect to silane was added in depositing the n-type silicon layer. Further, in depositing the p-type silicon layer, the heating temperature of the substrate was set to 200° C. while the flow rate ratio between the silane gas and hydrogen gas was set to 1:150. In depositing the i-type photoelectric conversion layer, the heating temperature of the substrate was set to 200° C. while the flow rate ratio between the silane gas and hydrogen gas was set to 1:70. In depositing the n-type silicon layer, the heating temperature of the substrate was set to 200° C. while the flow rate ratio between silane gas and hydrogen gas was set to 1:50.

The photoelectric conversion efficiency of the silicon-based thin-film photoelectric conversion device thus produced was measured by irradiating the device with pseudo sunlight of AM 1.5, 100 mW/cm$^2$ with a solar simulator. The measured photoelectric conversion efficiency was 8.3%. The substrate was then removed from the film deposition chamber. Then, to this chamber, as an etching gas and a diluent gas, nitrogen trifluoride and argon of 20 volume % in concentration were supplied for etching of the inside of the film deposition chamber under a pressure of 67 Pa. The etch rate at this time was at least 10 nm/s so that an n-layer and an i-layer of 50 nm in thickness were etched. After this, a subsequent substrate was fed into the film deposition chamber. Then, a second silicon-based thin-film photoelectric conversion device with the pin junction was produced by depositing pin layers as done for the first pin layers. Specifically, a boron-doped p-type silicon layer with a thickness of 10 nm, a non-doped i-type microcrystalline silicon photoelectric conversion layer with a thickness of 3 $\mu$m and a phosphorus-doped n-type silicon layer with a thickness of 20 nm were deposited by RF plasma CVD.

The silicon layers of the pin in the photoelectric conversion device were deposited in the same film deposition chamber by RF plasma CVD. A source gas of silane and hydrogen was used. As a doping gas in depositing the p-type semiconductor layer, diborane of 0.5 atomic percent with respect to silane was added. As a doping gas in depositing the n-type semiconductor layer, phosphine of 0.3 atomic percent with respect to silane was added. Further, in depositing the p-type semiconductor layer, the heating temperature of the substrate was set to 200° C. while the flow rate ratio between the silane gas and the hydrogen gas was set to 1:150. In depositing the i-type photoelectric conversion layer, the heating temperature of the substrate was set to 200° C. while the flow rate ratio between the silane gas and the hydrogen gas was set to 1:70. In depositing the n-type semiconductor layer, the heating temperature of the substrate was set to 200° C. while the flow rate ratio between the silane gas and the hydrogen gas was set to 1:50. Further, a conductive film of ZnO with a thickness of 50 nm and a metal electrode of Ag with a thickness of 300 nm were produced by sputtering to provide a back electrode unit.

Figure 4:
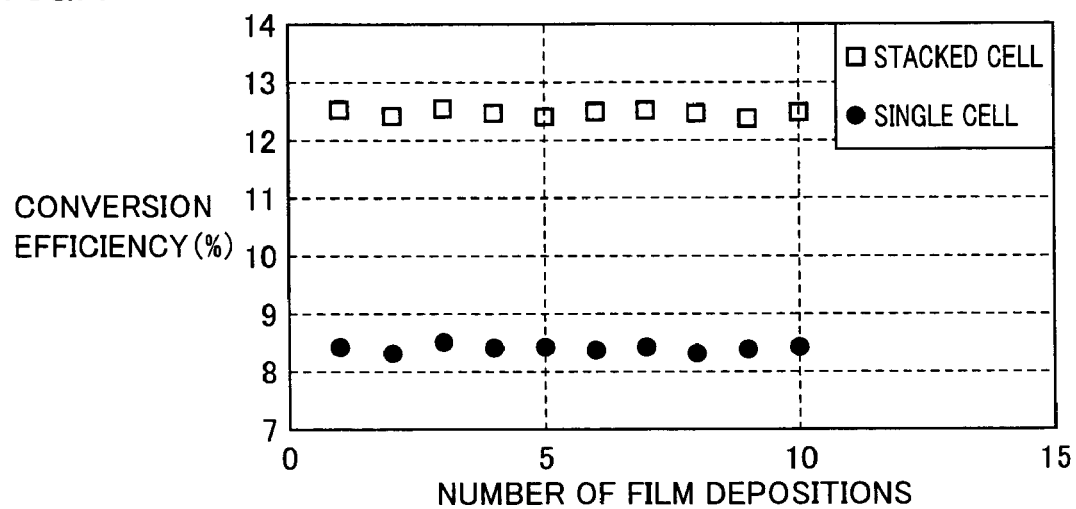
FIG. 4 shows a relation between photoelectric conversion efficiency and the number of times deposition of pin layers of repeatedly manufactured photoelectric conversion devices is done according to the present invention.

The photoelectric conversion efficiency of the second silicon-based thin-film photoelectric conversion device thus produced was measured by irradiating the device with pseudo sunlight of AM 1.5, 100 mW/cm$^2$ with the solar simulator. The measured photoelectric conversion efficiency was 8.4%. Using the same method as the above-described one, the pin deposition was repeated in the same film deposition chamber. FIG. 4 shows a relation between the number of times the pin deposition was done and the photoelectric conversion efficiency. It is seen from FIG. 4 that even after the tenth pin deposition was done, no significant characteristic change occurs. Further, a good manufacturing yield, 100% was achieved regardless of the number of times the deposition was done.

COMPARATIVE EXAMPLE 1

A silicon-based thin-film photoelectric conversion device was produced similarly to that of Example 1 except that first pin layers were deposited on a substrate, then the substrate was removed from the chamber and subsequently second pin layers were deposited on a subsequent substrate without eliminating influences of remaining n-type impurities. Of photoelectric conversion devices thus produced, the photoelectric conversion efficiency of the photoelectric conversion device with the secondly deposited pin layers was measured by a similar method to that in Example 1. The photoelectric conversion efficiency thus measured was 4.8% which was considerably lower than that in Example 1, while a good manufacturing yield of approximately 100% was still achieved. A comparison of spectral sensitivity curve was made between the photoelectric conversion device with the secondly deposited pin layers in Example 1 and the photoelectric conversion device with the secondly deposited pin layers in Comparative Example 1. Comparative Example 1 exhibited a significant deterioration in shortwave sensitivity as compared with Example 1.

EXAMPLE 2

Deposition of pin layers was successively done approximately 50 times under the conditions employed in Example 1 and consequently the total thickness of films remaining impurities stacked on the cathode reached 150 $\mu$m or more. Point detects due to peeling of the remaining films on the cathode were likely to occur and accordingly it was found that the manufacturing yield of photoelectric conversion devices decreases to 30% or lower. After the yield deterioration due to the peeling of remaining films was confirmed, the remaining films on the cathode were removed under the same conditions as the cleaning conditions used in removing remaining n-type impurities in the film deposition chamber in Example 1. Specifically, as an etching gas and a diluent gas, nitrogen trifluoride and argon gas of 20 volume % in concentration were supplied and etching was done under a pressure of 67 Pa. The resultant etch rate was 10 nm/s or higher so that all the stacked films with a thickness of 150 $\mu$m on the cathode resultant from 50 depositions of the pin layers could be etched away. After this, a dummy substrate was fed into the chamber for making the surface of the cathode electrode stable, and a layer of 1 $\mu$m in thickness was formed under the same conditions for the i-layer. Then, pin layers were deposited under the same conditions as those in Example 1 and a back electrode unit was deposited to produce a silicon-based photoelectric conversion device. The photoelectric conversion efficiency of the photoelectric conversion device was measured by a method similar to that in Example 1. The measured efficiency was 8.3%, which was an almost identical characteristic to the one in Example 1. Further, the manufacturing yield was still good, which was 100%.

EXAMPLE 3

On a photoelectric conversion device including an amorphous silicon-based photoelectric conversion layer, a photoelectric conversion device including a microcrystalline silicon-based photoelectric conversion layer that was firstly produced by a similar method to that in Example 1 was stacked to produce a stacked photoelectric conversion device having the structure as shown in FIG. 5. The photoelectric conversion efficiency of the stacked photoelectric conversion device was measured in a similar manner to that in Example 1 and the measurement was 12.5%. After this, by a method similar to that in Example 1, the cleaning process was followed for removing remaining n-type impurities. Then, a photoelectric conversion device having a microcrystalline silicon-based photoelectric conversion layer that was secondly produced was obtained. This photoelectric conversion device was then stacked on a photoelectric conversion device including an amorphous silicon-based photoelectric conversion layer to obtain a stacked photoelectric conversion device as shown in FIG. 5. The photoelectric conversion efficiency measured by a similar method to that in Example 1 was 12.4%, which was an almost equivalent characteristic to that of the firstly produced stacked photoelectric conversion device including the microcrystalline silicon-based photoelectric conversion layer. Similarly to Example 1, influences of remaining n-type impurities in the film deposition chamber were eliminated while pin layers were repeatedly deposited in the same film deposition chamber. FIG. 4 shows a relation between the number of times film deposition is made and photoelectric conversion efficiency. As seen from FIG. 4, no significant characteristic change occurs even after the tenth deposition was done. Further, the manufacturing yield was still good, which was 100%.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a silicon-based thin-film photoelectric conversion device having a multilayered structure comprised of a p-type semiconductor layer, an i-type microcrystalline silicon-based photoelectric conversion layer and an n-type semiconductor layer by plasma CVD, comprising the steps of:
   successively depositing said p-type semiconductor layer, said i-type microcrystalline silicon-based photoelectric conversion layer and said n-type semiconductor layer on a substrate within the same plasma CVD film deposition chamber;
   transferring said substrate out of said film deposition chamber; and
   eliminating influences of remaining n-type impurities on a cathode and/or within said film deposition chamber, on a subsequent step of depositing said p-type semiconductor layer, said i-type microcrystalline silicon-based photoelectric conversion layer and said n-type semiconductor layer.

2. The method of manufacturing a silicon-based thin-film photoelectric conversion device according to claim 1, wherein
   said p-type semiconductor layer has a thickness of at least 2 nm and at most 50 nm, said i-type microcrystalline silicon-based photoelectric conversion layer has a thickness of at least 0.5 $\mu$m and at most 20 $\mu$m, and said n-type semiconductor layer has a thickness of at least 2 nm and at most 50 nm.

3. The method of manufacturing a silicon-based thin-film photoelectric conversion device according to claim 1, wherein
   in said step of eliminating influences of remaining n-type impurities, the influences are eliminated by plasma decomposition of at least one type of gas selected from the group consisting of hydrogen gas, inert gas and fluorine-based cleaning gas.

4. The method of manufacturing a silicon-based thin-film photoelectric conversion device according to claim 1, wherein
   said step of eliminating influences of remaining n-type impurities includes the steps of:
   etching away an n-layer; and etching away an i-layer by at least 10 nm in thickness and at most a half in thickness of said i-layer.

5. The method of manufacturing a silicon-based thin-film photoelectric conversion device according to claim 1, further comprising the step of removing remaining impurities on the cathode, when the total thickness of a film formed of the remaining impurities on the cathode is at least 10 μm and at most 1000 μm, by plasma decomposition of at least one type gas selected from the group consisting of hydrogen gas, inert gas and fluorine-based cleaning gas.

6. The method of manufacturing a silicon-based thin-film photoelectric conversion device according to claim 1, wherein
said p-type semiconductor layer is deposited under the conditions that a heating temperature of said substrate is at most 550° C., a source gas supplied into said film deposition chamber includes a silane-based gas and a diluent gas containing hydrogen gas, and said diluent gas has a flow rate at least 100 times as high as a flow rate of said silane-based gas.

7. The method of manufacturing a silicon-based thin-film photoelectric conversion device according to claim 1, wherein
impurity atoms determining conductivity type of said p-type semiconductor layer are boron or aluminum atoms.

8. The method of manufacturing a silicon-based thin-film photoelectric conversion device according to claim 1, wherein
said i-type microcrystalline silicon-based photoelectric conversion layer is deposited under the conditions that a heating temperature of said substrate is at most 550° C., a source gas supplied into the film deposition chamber includes a silane-based gas and a diluent gas, said diluent gas has a flow rate at least 30 times and at most 100 times as high as a flow rate of said silane-based gas, and a peak intensity ratio at 480 nm$^{-1}$ and 520 nm$^{-1}$ measured by Raman spectroscopy, $I_{520}/I_{480}$, is 5–10.

9. The method of manufacturing a silicon-based thin-film photoelectric conversion device according to claim 1, wherein
impurity atoms determining conductivity type of said n-type semiconductor layer are phosphorus atoms.

10. The method of manufacturing a silicon-based thin-film photoelectric conversion device according to claim 1, wherein
said n-type semiconductor layer is deposited under the conditions that a heating temperature of said substrate is at most 550° C. and the content of phosphorus in a source gas supplied into said film deposition chamber with respect to silicon is at least 0.1 atomic percent and at most 5 atomic percent.

11. A method of manufacturing a stacked silicon-based thin-film photoelectric conversion device by stacking at least one photoelectric conversion device including an amorphous silicon-based photoelectric conversion layer on at least one photoelectric conversion device including a microcrystalline silicon-based photoelectric conversion layer manufactured according to the method recited in claim 1.

12. A silicon-based thin-film photoelectric conversion device manufactured according to the method recited in claim 1.

* * * * *